US006943826B1

(12) United States Patent
Tatekawa et al.

(10) Patent No.: US 6,943,826 B1
(45) Date of Patent: Sep. 13, 2005

(54) APPARATUS FOR DEBUGGING IMAGING DEVICES AND METHOD OF TESTING IMAGING DEVICES

(75) Inventors: Hiroshi Tatekawa, Hachioji (JP); Yukio Nishimura, Hachioji (JP); Katsumi Sakamoto, Hachioji (JP)

(73) Assignee: Agilent Technologies, Inc., Palo Alto, CA (US)

( * ) Notice: Subject to any disclaimer, the term of this patent is extended or adjusted under 35 U.S.C. 154(b) by 1102 days.

(21) Appl. No.: 09/605,509

(22) Filed: Jun. 28, 2000

(30) Foreign Application Priority Data

Jun. 30, 1999 (JP) .................................. 11-184837

(51) Int. Cl.[7] .............................................. H05N 7/18
(52) U.S. Cl. ..................................................... 348/126
(58) Field of Search ................................ 348/126, 129, 348/131, 132, 86; 382/141, 149; H04N 7/18

(56) References Cited

U.S. PATENT DOCUMENTS

| 5,650,844 A | 7/1997 | Aoki et al. ................. 356/237 |
| 5,801,764 A * | 9/1998 | Koizumi ..................... 348/125 |
| 6,674,884 B2 * | 1/2004 | Bacus et al. ................. 382/133 |
| 6,721,461 B1 * | 4/2004 | Nichani ....................... 382/270 |

FOREIGN PATENT DOCUMENTS

| DE | 43 38 390 A1 | 5/1995 |
| DE | 692 25 998 T2 | 1/1999 |
| JP | 7-230546 | 8/1995 |

OTHER PUBLICATIONS

Hoffmeister, H. German Search Report, Application No. 100 33 314.1, dated Jun. 6, 2001, not translated.
Ruppik, Gerhard, Den Partikeln auf der Spur. In: productronic 7/8, 1991, S.80.81, not translated.

* cited by examiner

*Primary Examiner*—Tung Vo
(74) *Attorney, Agent, or Firm*—Ohlandt, Greeley, Ruggiero & Perle, L.L.P.

(57) ABSTRACT

To facilitate the debugging an imaging device having a large number of pixels, a debugging apparatus has an image view display for qualitatively displaying pixel characteristics in a first range of the imaging device, and a code view displaying unit for quantitatively displaying numerical or symbolic data of individual pixels in a second range that is smaller than the first range and designated in an area displayed by the image view display.

7 Claims, 5 Drawing Sheets

APPARATUS FOR DEBUGGING IMAGING DEVICES AND METHOD OF TESTING IMAGING DEVICES

BACKGROUND OF THE INVENTION

1. Field of the Invention

The present invention relates to a debugging apparatus referred to as a viewer for analyzing and displaying measured data in a semiconductor test and a method of displaying test results.

2. Description of the Related Art

The resolution of imaging devices such as CCD chips is greatly increasing at present. The growing resolution of imaging devices requires imaging device tests to handle and process a very large amount of information.

Generally, when developing and testing image capturing devices or imaging devices such as CCDs, CMOS imagers, etc., it has been customary to capture an image of a test pattern with a device under test, output the captured image from the device, and inspect image data of the captured image processed for color filtering, smoothing, etc. to determine whether the device under the test is acceptable or not. To determine the acceptability of the tested device, the numerical values of the processed image data are inspected for all the pixels. In the inspection, it has been the general practice to employ an apparatus dedicated for testing imaging devices and automatically select those imaging devices whose values fall in a certain range according to a test program.

Recently, however, more and more imaging devices are tested using general-purpose semiconductor testing apparatus (so-called IC testers). When such a general-purpose IC tester is used to test an imaging device, no test pattern is employed, but the imaging device is placed on a test head connected to the IC tester, and irradiated with light to conduct the test. The operator operates a personal computer connected to the IC tester to analyze and display test results.

One conventional image inspection process is disclosed in Japanese laid-open patent publication No. 7-230546, for example. According to the disclosed image inspection process, an inspected image is displayed as a histogram and analyzed.

During a development stage for imaging devices, a test program often incorporates steps of displaying or printing processed results as binary, octal, or hexadecimal numerical values for the operator to confirm the processed results. Occasionally, the displayed and printed data may cover the values of all pixels of an imaging device being tested. In recent years, imaging devices with several million pixels have been developed and manufactured as such digital cameras are finding widespread use among consumers.

According to a conventional process of displaying test information, the characteristic value of each pixel is usually represented by an analog gradation, and those characteristic values of plural pixels are simultaneously displayed to generate an image of captured data on a display unit. Specific numerical values for pixels can be displayed by moving a cursor or the like, and can be retrieved when necessary. When such pixel information is displayed as areas with varying brightness and darkness (luminance information) on the display unit, the operator can recognize the general tendency of the pixel information. However, the operator finds it difficult to determine and compare specific values, such as specific numerical values for certain pixels and differences between specific numerical values for adjacent pixels, e.g., upper, lower, left, and right pixels, from only the displayed pixel information.

Even though the test program incorporates the steps of displaying or printing all numerical data of pixels of an imaging device for confirmation, it is tedious and time-consuming for the operator to confirm a certain area of pixels because the numerical data are too many if the number of the pixels in the imaging device is very large. If a range to be displayed is specified in the displaying step, then when such a range is changed, the displaying step incorporated in the test program has to be changed. For displaying numerical values, they should not only be dumped and displayed successively in the order of addresses, but also be dumped while relative positions of the addresses are being calculated taking the arrangement of the pixels in the imaging device into consideration, so that, for example, the numerical values of horizontally adjacent pixels can be compared with each other and also the numerical values of vertically and obliquely adjacent pixels can be compared with each other. If the number of vertically and horizontally arrayed pixels is very large, then special care must be taken to dump and display the numerical values of the pixels. A large expenditure of labor and time may be required to incorporate, in each test program, the displaying step taking into account the proper relationship between an area that needs to be displayed and the addresses of original data.

For observing the tendency among codes representing the characteristics of each dot in an imaging device under test, the codes may be displayed as characters or symbols directly over a map which is displayed on a display screen as representing the imaging device. However, since the codes displayed as characters or symbols take up relatively large areas on the display screen, the range that can be displayed by the codes at once is more limited than the range that can be displayed using dots, and hence all the data cannot be displayed together on the display screen.

Also a display unit is known for displaying a dot image of visual luminance information converted from original data or processed data.

OBJECTS AND SUMMARY OF THE INVENTION

It is therefore an object of the present invention to easily display a code view in a necessary area of an imaging device under test for the operator to be able to read the detailed and specific tendencies of characteristic changes among pixels in the necessary area of the imaging device.

Another object of the present invention is to relate an area to be displayed in the code view to an area to be displayed in an image view, so that all necessary data can be displayed using codes in the code view while at the same time they can also be displayed as an image in the image view.

According to an aspect of the present invention, there is provided an apparatus for debugging an imaging device, comprising an image view display or image view displaying means for qualitatively displaying pixel characteristics in a first range of the imaging device, and a code view display or code view displaying means for quantitatively displaying numerical or symbolic data of individual pixels in a second range that is smaller than the first range and designated within an area displayed by the image view display.

According to another aspect of the present invention, there is also provided a semiconductor testing apparatus for testing an imaging device, comprising a test head for reading an output signal from an imaging device under test; an IC tester which receives and processes output data from the test head; a memory for storing output data from the IC tester; a display unit for displaying data stored in the memory; an input device for receiving an operator's command; a central processing unit for processing data stored in the memory based on an operator's command received from the input device, which central processing unit connected to the display unit and the input device and the IC tester; an image view display for qualitatively displaying pixel characteristics in a first range of the imaging device on the display unit according to an operator's command; and a code view display for quantitatively displaying numerical or symbolic data of individual pixels in a second range that is smaller than the first range and designated within an area displayed by the image view display on the display unit, whereby data with respect to the pixel characteristics of the imaging device can be displayed by means of the image view display or the code view display or both.

According to still another aspect of the present invention, there is further provided a method of testing an imaging device, comprising the steps of retrieving output data from the imaging device as digital data, qualitatively displaying the digital data as an image view in a first range of the imaging device, receiving the designation of a second range that is smaller than the first range in the qualitative image view, and quantitatively displaying characteristics of pixels within the second range in the imaging device with numerical or symbolic codes.

The present invention also provides a computer-readable recording medium storing a program for carrying out the above method. Specifically, there is provided a computer-readable recording medium storing a program for enabling a computer to function as an image view display for qualitatively displaying pixel characteristics in a first range of an imaging device, and a code view display for quantitatively displaying numerical or symbolic data of individual pixels in a second range that is smaller than the first range and designated within an area displayed by the image view display.

According to the present invention, an operator can easily display pixel data in both the image view and the code view and also switch between the image view and the code view. While analyzing pixel data, the operator can make detailed judgements on pixel data for a certain area simply by designating that area for observation. Therefore, the operator finds it easy to debug the imaging device which has a relatively large number of pixels.

DETAILED DESCRIPTION OF THE PREFERRED EMBODIMENTS

In the following description, the display of data relative to a pixel as an image will be referred to as an "image view", and the display of numerical values representative of the characteristics of pixels as binary, octal, decimal, hexadecimal, or other numerical values or symbols will be referred to as a "code view". When an area is designated in the image view, the code view can be generated for the designated area. Therefore, the code view can be generated easily from the image view.

The image view refers to a display process in which each or a few pixels of an imaging device are associated with respective pixels in a display unit, and the characteristic values of pixels of the imaging device are displayed as color changes or monochromatic shades on the display unit. Specifically, the characteristic values of pixels in the imaging device are numerically processed for increasing contrast, low-pass filtering, finding variations from their average, and singularity processing, and the processed characteristic values are presented in an easily recognizable fashion to the operator. Therefore, image views are suitable for the operator to view qualitative changes of the characteristics of the pixels in the overall imaging surface of the imaging device or in a wide range in the imaging surface of the imaging device. For example, image views are suitable for the operator to recognize a defective group of pixels or shading, i.e., gradual characteristic fluctuations, among widely spaced pixels, e.g., among upper and lower ends of the imaging surface of the imaging device. However, while the operator can understand a general tendency of the imaging device from the image view, the operator finds it difficult to clearly recognize how the characteristics of a certain pixel change from the characteristics of an adjacent pixel. Furthermore, using the image view, it is not possible for the operator to find out whether a defect appearing as a dot is related to a single pixel or a plurality of pixels. The code view is a display process which allows the operator to view quantitative data of the characteristic values of pixels. It should, however, be noted that the code view does not necessarily display data from an IC tester as they are. Rather, depending on the nature of test items or the type of information required by the operator, the numerical values of pixels for code views may be limited in the number of digits to be displayed, converted into symbols, displayed as binary, octal, decimal, hexadecimal, or other numerical values, or filtered.

Figure 1:
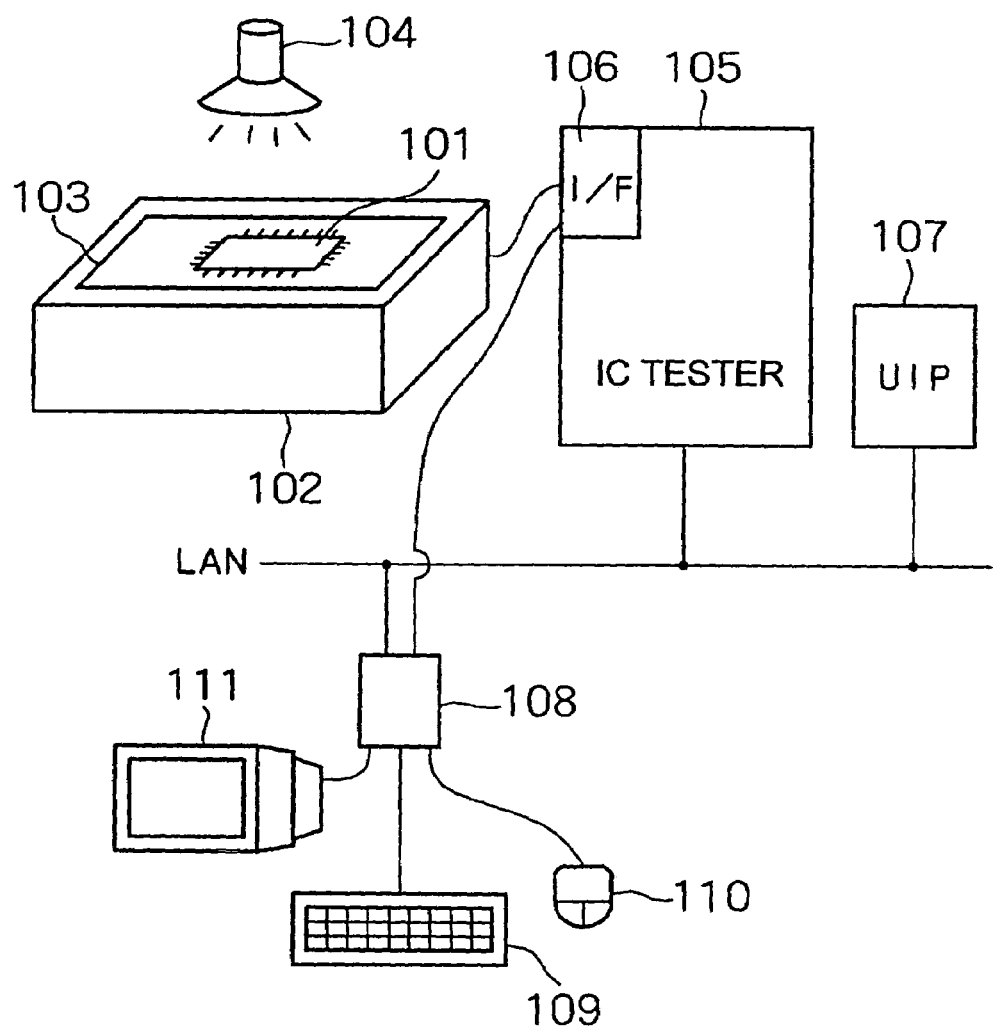
FIG. 1 is a block diagram of an overall arrangement of a test system including viewers according to the present invention.

FIG. 1 shows in a block form an overall arrangement of a test system having the viewer according to the present invention. As shown in FIG. 1, an imaging device 101, which is a device under test (DUT), is electrically connected to a DUT board 103 placed in a test head 102. Light is applied from a light source 104 to the imaging device 101 to cause the imaging device 101 to output electric signals under the control of an IC tester 105. The operator controls the IC tester 105 from a user interface control processor (UIP) 107 via a LAN such as the Ethernet or a bus. Digital data output from the DUT board 103 is delivered via an interface board (not shown) in the test head 102 to an interface 106 in the IC tester 105. The timing of the digital data is adjusted by a timing control unit (not shown) in the IC tester 105, and then sent to an image processor 108. The image processor 108 includes a keyboard 109 and a mouse 110 that are operated by the operator, and a display unit 111. The image processor 108 can process and display received digital data. The image processor 108 comprises a personal computer or a computer such as a work station, for example. The image processor 108 is connected to the IC tester 105 and the UIP 107 by a LAN such as the Ethernet or a bus for exchanging test information and processed data therewith.

Figure 2:
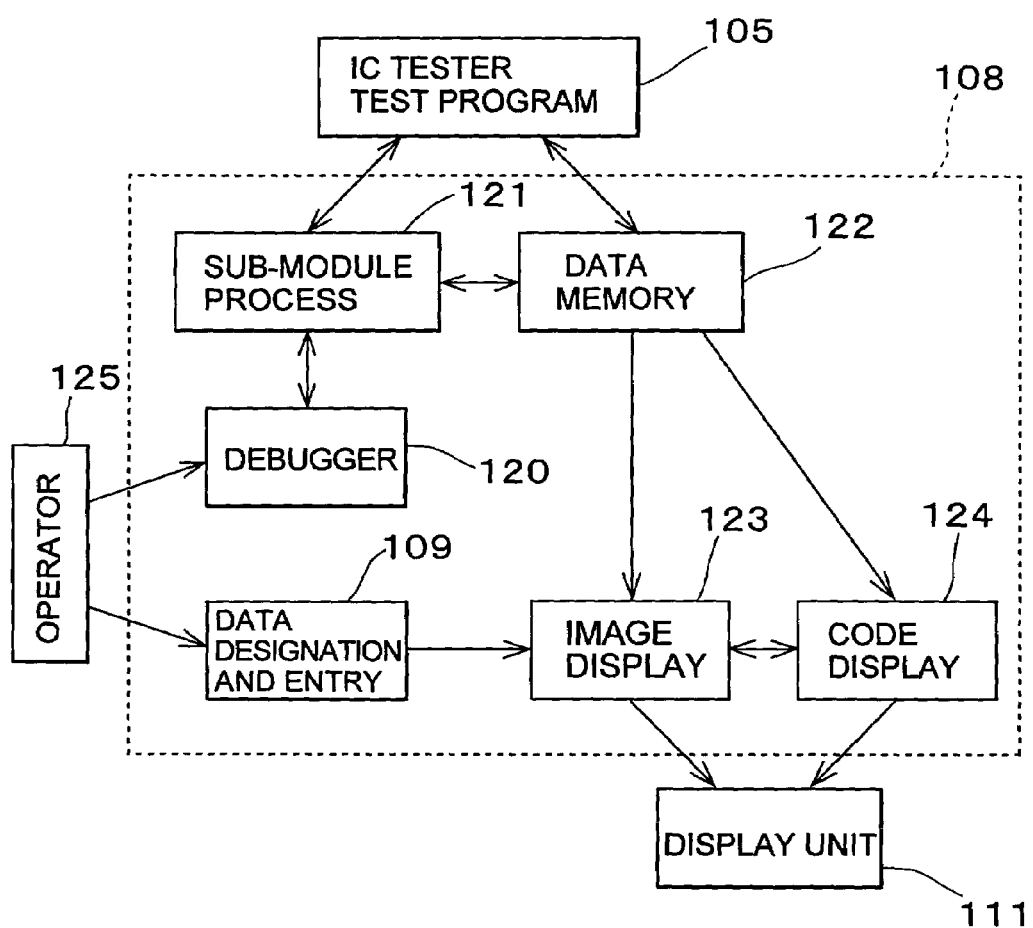
FIG. 2 is a block diagram of a software architecture required to test an imaging device with an IC tester according to the present invention.

FIG. 2 shows in block form a software architecture required to test an imaging device with the IC tester 105. A test program for generally managing and conducting a test in its entirety is run by the IC tester 105. The test program controls an imaging device under test to output data which is read into the image processor 108 by an image processing program run by the image processor 108. The image processor 108 has a debugger 120, a sub-module process 121, a data memory 122, an image display viewer 123, and a code display viewer 124. The debugger 120, the image display viewer 123, and the code display viewer 124 are directly operated by an operator 125. The data memory 122 has a storage capacity large enough to store a plurality of sets of data for all the pixels in the imaging device under test. One-dimensional data obtained in one measurement cycle by sweeping all the pixels is stored in the data memory 122, and analyzed with respect to necessary test items. Analyzed data is stored in the data memory 122, so that old and new analyzed data can be compared with each other.

Figure 3:
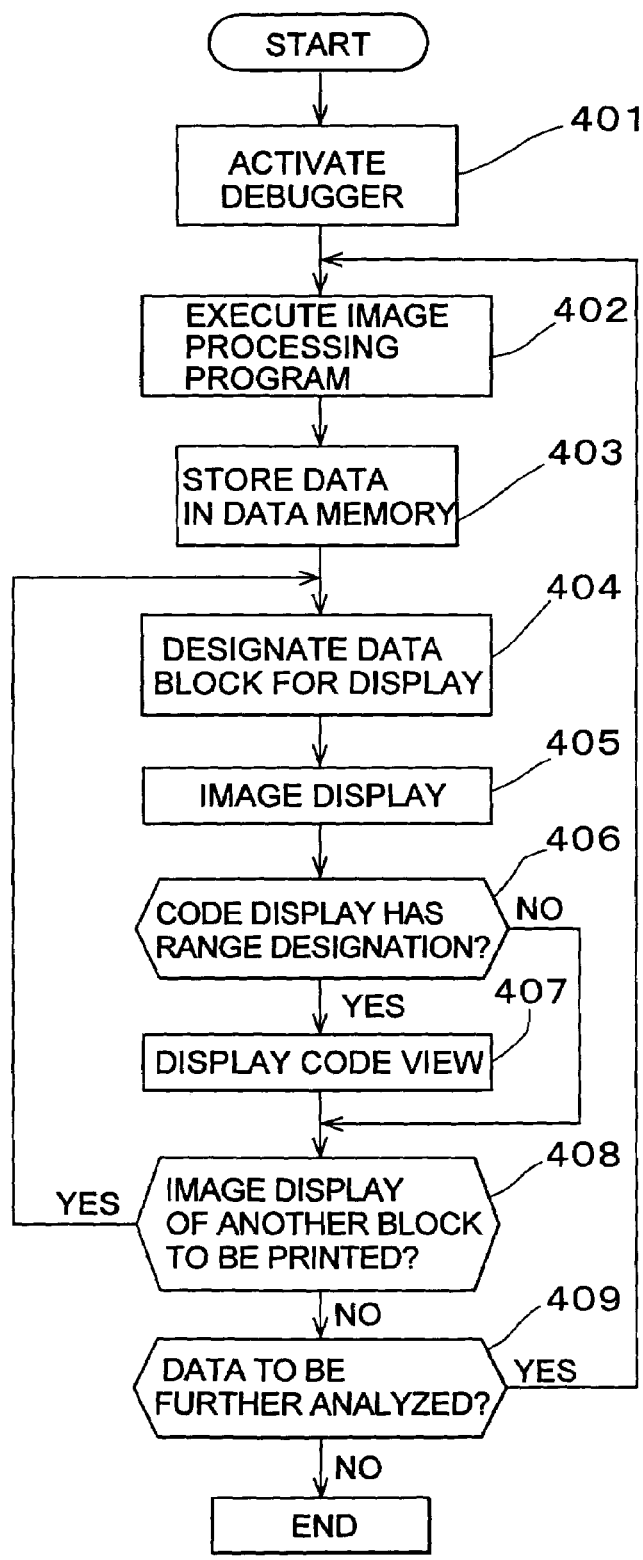
FIG. 3 is a flowchart of an operation sequence of a debugger for an imaging device.

FIG. 3 shows an operation sequence of the debugger 120, which is executed by the image processor 108. A process of debugging test results for an imaging device with the debugger 120 will be described below with reference to FIG. 3. First, the debugger 120 is activated in step 401, and executes an image-processing program on the image processor 108 in step 402. Output data produced from the imaging device under test according to the image processing program is retrieved into the data memory 122 in step 403. The debugger 120 specifies which block of the data in the data memory 122 is to be displayed in step 404, and then presents an image display in step 405. The debugger 120 determines, from the image display, whether there is a range to be presented in the code display or not in step 406. If there is a range to be presented for a code display, then the debugger 120 presents a code display in the range in step 407. Thereafter, the debugger 120 determines whether there is another block for code display or not in step 408. If there is another block for code display, then control returns to step 404 in which the debugger 120 specifies the block of the data in the data memory 122 is to be presented. If there is no range to be shown in the code display in step 406, then control jumps to step 408 in which the debugger 120 determines whether there is another block for code display or not. If there is no other block for code display in step 408, then the debugger 120 determines whether the data is to be further analyzed or not in step 409. If the data is to be further analyzed, then control returns to step 402. If the data is not to be further analyzed, then the operation sequence of the debugger 120 is ended. In this manner, the operator can debug the imaging device under test to see if each of the pixels of the imaging device has a problem or not, or if the controlling of the imaging device according to the test program run by the IC tester 105 is problematic or not, while switching between image and code displays on the display unit 111.

Figure 4:
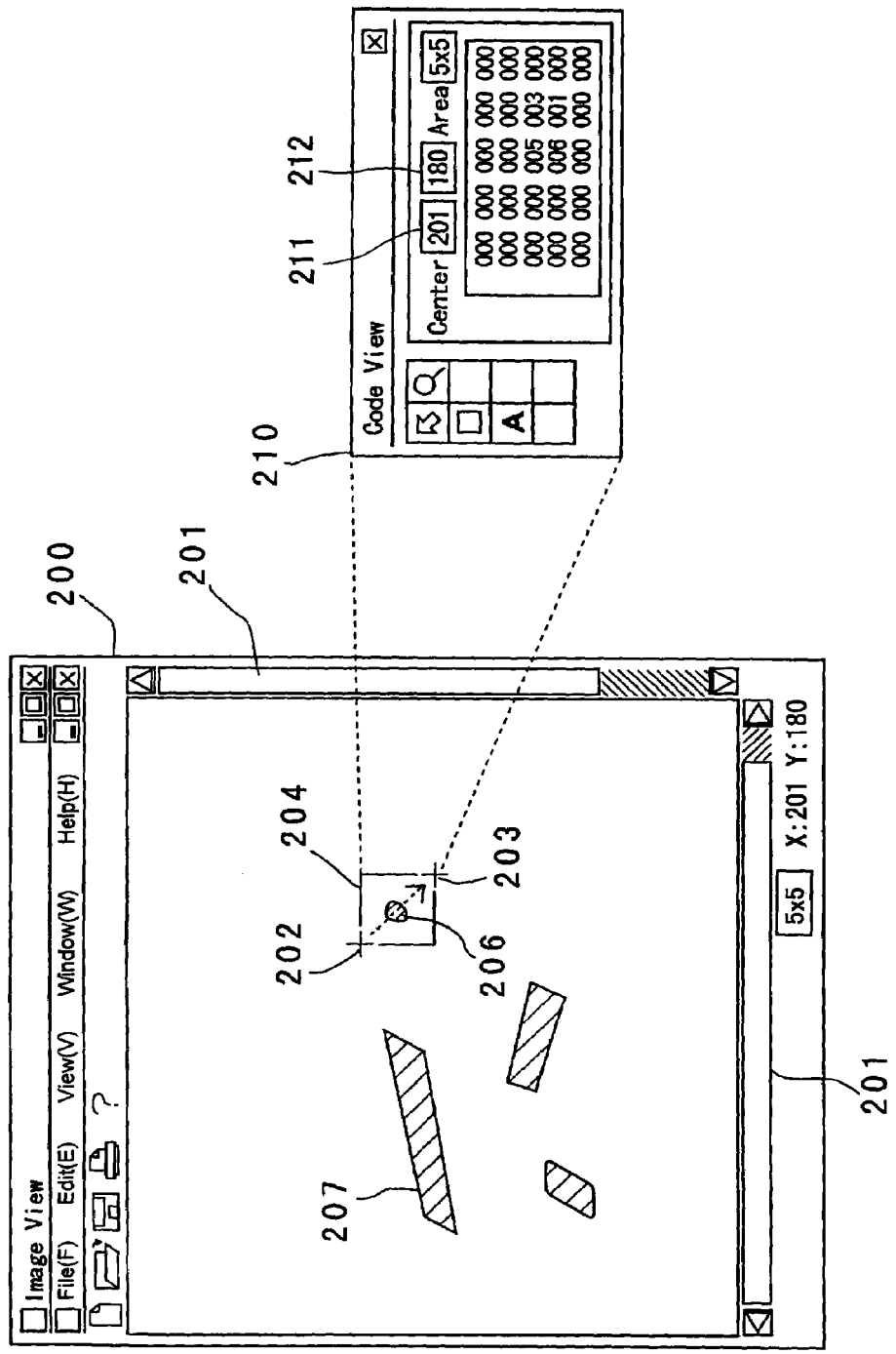
FIG. 4 is a view showing an example of an image view and a code view which are displayed according to the present invention.

FIG. 4 shows an example of presented display views produced by the viewer of the present invention. As shown in FIG. 4, output data from the imaging device under test is displayed as an image display view 200 on the display screen of the display unit 111. The image display view 200 may comprise monochromatic or colored gradations. In the illustrated example, pattern data from the imaging device under test, which has a large number of pixels, is to be displayed. Because the pattern data to be displayed is very large, only a certain range of all the pixels of the imaging device is displayed in the image display view 200. The image display view 200 includes a scroll bar 201. When the operator operates the scroll bar 201, the displayed pixel range can freely be moved in the image display view 200. In this example, the operator designates an initial cursor (or pointer) position 202 in the image display view 200 as a starting point for a rectangular area, and then designates an ending point 203 for the rectangular range by dragging the mouse or operating a key on the keyboard 109, for example. Thereafter, the operator operates the mouse or the keyboard to give a command to display a code display view 210. When the operator specifies the cursor positions 202, 203, a frame 204 of the rectangular area may be displayed to allow the operator to visually recognize the selected rectangular area. The image display view 200 also shows a black dot 206 as a defect in the rectangular area and other defects 207 of the imaging device under test.

The image display view 200 shows, in a lower right corner thereof, coordinates of the center of the rectangular area and a selected size of the rectangular area shown as the code display view 210. The code display view 210 shows codes including numerical values and symbols. The image display view 200 and the code display view 210 may be presented in various patterns, e.g., in an overlapping manner or separately as individual windows, or may be selectively displayed one at a time. The code display view 210 may be presented in a size that is automatically variable depending on the number of pixels shown, or may be shown in a fixed size at all times. At any rate, once the image display view 200 and the code display view 210 are shown, their sizes and positions should preferably be made variable by the cursor, which can be moved by the mouse or the keyboard. The test program developer or the operator can thus confirm easily certain pixels and their numerical values while the pixels are being held in a mutual positional relationship. The image display view 200 and the code display view 210 enables the test program developer or the operator to verify whether the output data from the imaging device under test are properly processed, confirm what numerical value a certain white dot on the imaging device under test has as a code, and obtain materials for debugging decisions as to whether the imaging device is operating properly or the test program contains an error, through comparison between the numerical values of adjacent pixels.

The debugging apparatus according to the present invention is capable of efficiently debugging imaging devices under stricter inspection standards. The debugging apparatus also allows the operator to grasp macroscopic characteristic changes in entire displayed images, such as slow pixel characteristic fluctuations, of imaging devices having a large number of pixels, and also to reliably recognize changes that may often be overlooked when many pixels are shown in one image on the imaging devices, such as small changes found through comparison between the characteristic values of adjacent pixels or a defect of a single pixel or a plurality of pixels.

The cursor shown in the image display view 200 may be in the form of a criss-cross shape or an arrow shape. While a rectangular area can be specified in its entirety to be displayed as a code display view as described above with reference to FIG. 4, the code display view may be presented for a rectangular area having a predetermined size surrounding a central point that has been specified by the operator.

When the cursor in the image display view 200 is moved through the use of the mouse or the keyboard, the codes related to the pixels in the code display view 210 are accordingly updated on a real-time basis. Alternatively, the codes in the code display view 210 may not be updated until the cursor is moved to a point and the point is determined by clicking the mouse.

Furthermore, the window of the code display view 210 may be focused or made active and entry modes may be changed, and then X, Y coordinates of the cursor may be entered as numerals directly into entry display frames 211, 212 in an upper portion of the code display view 210, or the cursor in the image display view 200 may be operated by the keyboard to move a central pixel in the image display view 200, so that the range of pixels presented in the image display view 200 and the code display view 210 can be moved. A marker representing pixel data at the central position in the code display view area may be shown in the code display view 210. For example, such a marker may comprise a numerical value or a background shown in a special color.

Figure 5:
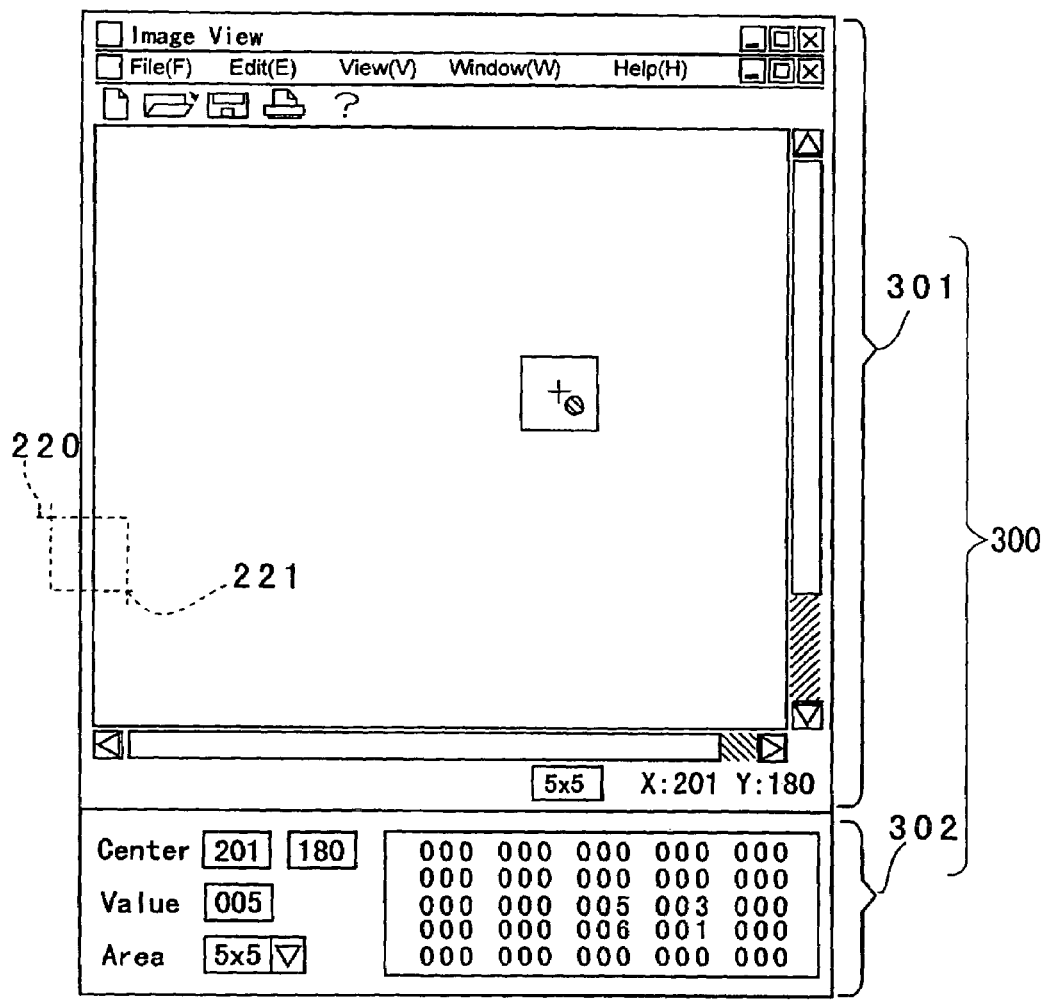
FIG. 5 is a view showing another example of an image view and a code view which are displayed according to the present invention.

FIG. 5 shows another example of an image display view and a code display view which are shown according to the present invention. In the example shown in FIG. 5, both image and code views are shown, and as the cursor moves in the image display view, codes corresponding to pixels in an area to be shown in the code display view are newly calculated, and the code display view is updated into new codes. Specifically, as shown in FIG. 5, a displayed image 300 includes an image display view 301 and a code display view 302, with a cursor displayed in the image display view 301. When the cursor is moved in the image display view 301, codes displayed in the code display view 302 are updated.

Codes are displayed in the code display view 302 immediately after effective data are displayed in the image display view 301. Alternatively, codes may be displayed in the code display view 302 or displayed codes may be updated in the code display view 302 when the mouse or the keyboard is operated in a certain way after effective data are displayed in the image display view 301 and the cursor is moved.

When the center of the cursor is located at an upper, lower, left-hand, or right-hand end of the image display view 301, e.g., at a left-hand end of the image display view 301 as shown in FIG. 5, and a rectangular area for the code display view 302, e.g., a rectangular area having a starting point 220 and an ending point 221 as indicated by the dotted line in FIG. 5, has a portion projecting out of the image display view 301, the code display view 302 may display non-code data with special characters, e.g., hyphens "- - -" in its region corresponding to the projecting portion of the rectangular area. The code display view 302 may also display such non-code data with characters other than hyphens, blanks, other symbols, or colors. The image processor 108 is implemented such that when the cursor (pointer) in the image display view 301 moves toward an upper, lower, left-hand, or right-hand end of the range to be tested of the imaging device and the range of codes to be shown in the code display view 302 is about to move beyond the end of the range to be tested of the imaging device, the cursor (pointer) is stopped against movement beyond the end of the range. However, the image processor 108 may alternatively be implemented such that when the range of codes to be shown in the code display view 302 is about to move beyond the end of the range to be tested of the imaging device, the cursor (pointer) may not be limited in its movement, but non-code data may be shown in the code display view 302 in response to the movement of the cursor (pointer).

The entire disclosure of Japanese Patent Application No. 184837/1999 filed on Jun. 30, 1999 including specification, claims, drawings, and summary are incorporated herein by reference in its entirety.

What is claimed is:

1. An apparatus for debugging an imaging device, comprising:
    an image view display for qualitatively displaying pixel characteristics in a first range of the imaging device; and
    a code view display for quantitatively displaying numerical or symbolic data of individual pixels in a second range that is smaller than said first range and designated within an area displayed by said image view display, wherein said code view display comprises a code view and a marker display for indicating data shown at a central position in said code view display.

2. A semiconductor testing apparatus for testing an imaging device, comprising:
    a test head for reading an output signal from an imaging device under test;
    a memory which stores output data from said test head; and
    an image processor which processes the output data stored in said memory;
    wherein said image processor comprising:
        a display unit for displaying data stored in said memory;
        an input device which receives an operator's command;
        wherein said image processor processes data stored in said memory means based on an operator's command received from said input device;
    wherein said image processor comprises an image view display for qualitatively displaying pixel characteristics in a first range of the imaging device on said display unit according to an operator's command, and a code view display for quantitatively displaying on said display unit numerical or symbolic data of individual pixels in a second range that is smaller than said first range and designated in an area displayed by said image view display;
    whereby data with respect to the pixel characteristics of the imaging device can be displayed by said image view display or said code view display or both, wherein said code view display comprises a code view and a marker display for indicating data shown at a central position in said code view display.

3. A semiconductor testing apparatus according to claim 2, wherein said image view display comprises an image view, and an area display that indicates on the image view a code display area of the code view.

4. A semiconductor testing apparatus according to claim 2, wherein said code view display comprises a code view and a coordinate display for displaying the coordinates of data located at a central position in said code view display.

5. A method of testing an imaging device, comprising the steps of:
    retrieving output data from the imaging device as digital data;
    qualitatively displaying the digital data as an image view in a first range of the imaging device;
    accepting the designation of a second range that is smaller than said first range in the image view, which qualitatively displays digital data; and
    quantitatively displaying characteristics of pixels in the imaging device within said second range with numerical or symbolic codes corresponding to a code view and a marker display for indicating data shown at a central position in said code display.

6. A method according to claim 5, wherein the step of retrieving output data from the imaging device comprises the step of processing the retrieved digital data.

7. A computer-readable recording medium storing a program for enabling a computer to function as:

an image view display for qualitatively displaying pixel characteristics in a first range of an imaging device; and a code view display for quantitatively displaying numerical or symbolic data of individual pixels in a second range that is smaller than said first range and designated within an area displayed by said image view display, wherein said code view display comprises a code view and a marker display for indicating data shown at a central position in said code view display.

* * * * *